United States Patent
Brox et al.

(10) Patent No.: US 6,700,426 B2
(45) Date of Patent: Mar. 2, 2004

(54) PROGRAMMABLE VOLTAGE PUMP HAVING A GROUND OPTION

(75) Inventors: Martin Brox, München (DE); Bernd Klehn, Unterhaching (DE); Joachim Schnabel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/302,864

(22) Filed: Nov. 25, 2002

(65) Prior Publication Data

US 2003/0128066 A1 Jul. 10, 2003

(30) Foreign Application Priority Data

Nov. 26, 2001 (GE) .......................... 101 57 865

(51) Int. Cl.[7] .................... H03L 5/00; H03K 5/08; H03K 3/01
(52) U.S. Cl. ............... 327/306; 327/309; 327/530; 327/534
(58) Field of Search ................. 327/530, 534, 327/535, 537, 306, 309, 313, 319, 321, 327, 331, 333

(56) References Cited

U.S. PATENT DOCUMENTS

| | | | | | |
|---|---|---|---|---|---|
| 5,029,282 A | * | 7/1991 | Ito | ........................ | 327/536 |
| 5,081,371 A | | 1/1992 | Wong | ........................ | 327/536 |
| 5,347,170 A | * | 9/1994 | Hayakawa et al. | ......... | 327/541 |
| 5,537,077 A | * | 7/1996 | Schnizlein | .................... | 327/589 |

FOREIGN PATENT DOCUMENTS

DE        69113399        11/1990

* cited by examiner

Primary Examiner—Tuan T. Lam
(74) Attorney, Agent, or Firm—Greenblum & Bernstein, P.L.C.

(57) ABSTRACT

Programmable voltage pump for producing an output voltage includes a trim input configured to set the output voltage, an output configured to emit the output voltage therefrom, and an activation/deactivation input configured to at least one of activate and deactivate the voltage pump. The activation/deactivation input includes a switch connected to the output, the switch configured to selectively connect a network to ground, the network being connected to the output.

18 Claims, 1 Drawing Sheet

PROGRAMMABLE VOLTAGE PUMP HAVING A GROUND OPTION

CROSS-REFERENCE TO RELATED APPLICATION

The present application claims priority under 35 U.S.C. §119 of German Patent Application No. 101 57 865.2, filed on Nov. 26, 2001, the disclosure of which is expressly incorporated by reference herein in its entirety.

BACKGROUND OF THE INVENTION

The present invention relates to a programmable voltage pump having a ground option.

DESCRIPTION OF BACKGROUND INFORMATION

Programmable voltage pumps are used, for example, in memory modules, such as DRAMs, in order to produce different negative voltages for the MOS selection transistors of the memory elements (memory capacitors). In this case, the programmable voltage pumps are an integrated component of the memory modules.

In DRAM memory modules, the programmable voltage pumps are essentially used to produce two important negative voltages, the voltage (VBB) for the p-well of a selection transistor of a cell, and the voltage (VNWL) on a word line that is not selected, that is to say the gate voltage of the selection transistor.

Until now, ground potential has normally been used for a non-selected word line. In the meantime, slightly negative voltages are being introduced, in order to improve the blocking behavior of the selection transistor. This has the advantage that the leakage current through the transistor decreases as the gate voltage falls.

In contrast, the absolute value of VBB is ever more closely approaching the value of 0V. In consequence, the potential difference between the diffusion connection for the memory capacitor and the p-well is kept as low as possible, in order thus to avoid large leakage currents at this pn-junction. On the other hand, the leakage current through the transistor rises as the p-well voltage becomes less in absolute terms.

In order to set an optimum operating point—that is to say the first aim is to achieve a good blocking behavior of the transistor, and secondly to achieve as low a leakage current as possible at the pn-junction of the well/diffusion— programmable voltage pumps are used whose output voltage can be adjusted within a predetermined voltage range. If it is found that the ground connection (0V) is the best operating point, then the voltage pump is deactivated in order to avoid consuming power unnecessarily, and the load to be driven is connected to ground.

A conventional programmable voltage pump, which is also referred to as a voltage pump, is illustrated in FIG. 1.

The illustrated programmable voltage pump has a trim input TRIM, via which a desired output voltage VNEG can be set, as well as an output OUT at which the output voltage VNEG is emitted.

When using the voltage pump 1 in a DRAM module, the output OUT may be connected either to the p-well or to the VNWL network.

The illustrated voltage pump 1 furthermore has an activation input ACTIVE, by means of which the voltage pump 1 can be activated and deactivated. If it is found in test trials that, for example, the ground connection represents the best operating point for the p-well of the selection transistor, then the voltage pump 1 is deactivated, and the appropriate network, which is connected to the output OUT, is permanently connected to ground (see optional connection 8). For this purpose, the voltage pump 1 has the option of changing the connection to the activation input ACTIVE and to the output OUT of the voltage pump 1.

The voltage pump 1 is activated by the activation input ACTIVE being connected, as illustrated, to a supply voltage $V_{DD}$. In order to deactivate the voltage pump 1, the connection 7 is connected to ground. Furthermore, the output OUT of the voltage pump 1 is decoupled from the connected network (not shown), and the latter is connected to ground at the connection 8.

This procedure has a number of disadvantages: firstly, the process of changing the connections is relatively time-consuming and costly since a new lithography mask must be produced and must be introduced into the wafer production process while, secondly, the option of connecting the connected network to a negative potential is no longer available, as soon as it has been connected to ground.

SUMMARY OF THE INVENTION

A feature of the present invention provides a programmable voltage pump whose output voltage can be set in a predetermined range, including 0V.

The present invention provides a programmable voltage pump, having a trim input for setting a desired output voltage and having an output at which the output voltage is emitted, with a switch which is connected to the output and can selectively connect the output of the voltage pump to ground. In this way, it is possible to choose between a desired output voltage and ground by trimming the voltage pump or by driving the switch.

The voltage pump may provide for the deactivation of the voltage pump on selection of the ground option at the output of the voltage pump.

According to one feature of the invention, the voltage pump furthermore has a control circuit for controlling the switch as a function of the signal which is applied to the trim input.

The control circuit has means to whose input the trim signal is supplied. These means, which may be but are not limited to a logic gate, may at the same time be used for deactivation of the voltage pump. They are thus preferably connected to the activation input of the voltage pump. The logic gate may be, for example, a NAND gate.

According to one feature of the invention, the control circuit has a level shifter, which produces a specific control voltage for the output switch.

The control circuit may have a first pair of parallel-connected MOS transistors and a second pair of cross-coupled MOS transistors.

The switch which is connected to the output of the voltage pump may be in the form of an NMOS transistor, whose p-well is connected to the output voltage of the voltage pump.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
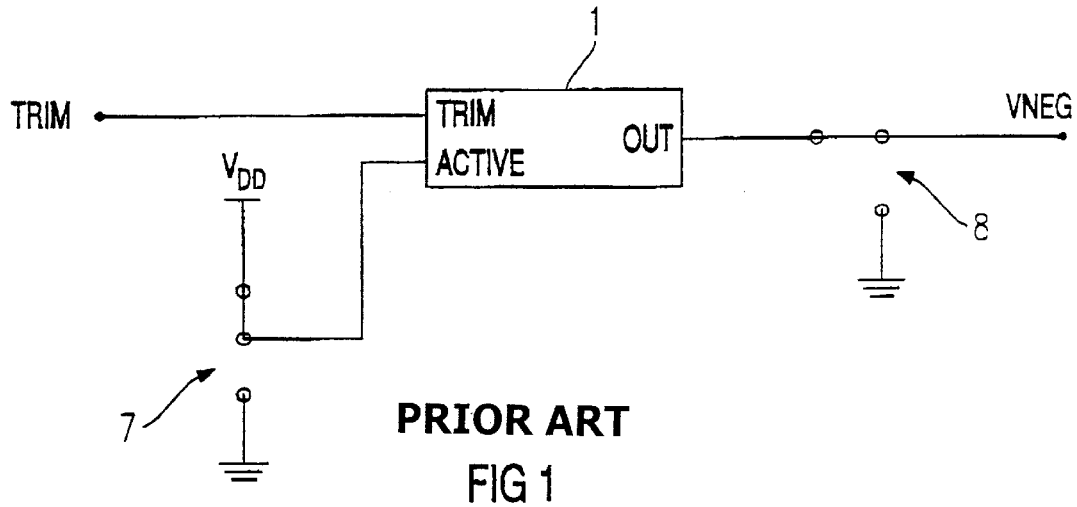
FIG. 1 shows a conventional implementation of a voltage pump with a mask option.
Figure 2:
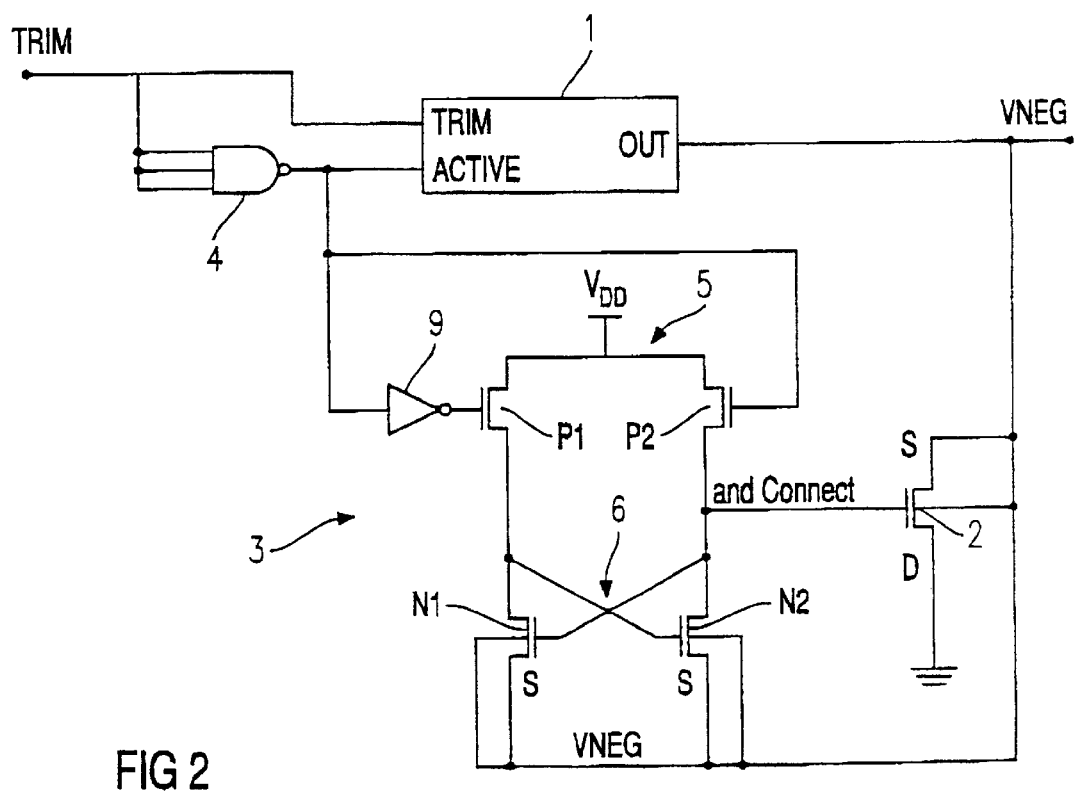
FIG. 2 shows an implementation of a voltage pump according to one exemplary embodiment of the invention.

Referring to the drawings wherein like characters represent like elements, FIG. 2 shows a programmable voltage pump 1 having a trim input TRIM for setting a desired output voltage VNEG, as well as an output OUT for producing the desired supply voltage VNEG.

The voltage pump 1 also has an activation/deactivation input ACTIVE for activation/deactivation of the voltage pump 1.

As mentioned, the voltage pump 1 produces a predetermined output voltage VNEG as a function of a signal which is applied to the trim input TRIM. The trim signal is normally a coded signal comprising a number of trim bits, by means of which the output voltage VNEG can be set as required. If the trim signal contains, for example, three trim bits, a total of eight ($2^3$) different output voltages VNEG can be set.

The trim signal is applied firstly to the trim input TRIM and secondly to a logic gate, in the present case a NAND gate 4. The output of the NAND gate 4 is connected to the activation input ACTIVE of the voltage pump 1. If at least one of the trim bits has the value 0, then the output of the NAND gate 4 is high, and the voltage pump 1 is activated and generates a negative output voltage VNEG, which is predetermined by the coding.

The output OUT of the voltage pump 1, or the network which is connected to the output OUT, may be selectively connected to ground by means of a switch 2. In the present exemplary embodiment, the switch 2 is in the form of an NMOS transistor.

A control circuit 3 is provided for controlling the switch 2, and controls the switch 2 as a function of the signal which is applied to the activation input ACTIVE.

The control circuit 3 has a so-called level shifter with a first pair of transistors 5 (P1, P2) as well as a second pair of cross-coupled transistors 6 (N1, N2). The level shifter is able to draw the control connection (gate) of the NMOS transistor 2 to the negative output voltage VNEG, or to raise it to a supply voltage $V_{DD}$.

When the voltage pump 1 is in the active state—the activation signal is high in the present exemplary embodiment—the transistor P1 is switched to have a low impedance owing to the upstream inverter 9, and the high level is thus applied to the gate connection of the transistor N2, which thus likewise has a low impedance. Since the source connection S of the transistor N2 is connected to the output voltage VNEG, the gate connection of the NMOS transistor 2 is drawn to VNEG, so that the transistor 2 is switched off.

The connection of the p-well and the source connection S of the transistor 2 are connected to the output voltage VNEG.

In this state, both transistors P2 and N1 are switched off.

If all the trim bits are programmed with "1", then an activation signal with a logic zero level is produced at the output of the NAND gate 4 and is applied to the activation input ACTIVE of the voltage pump 1, so that the voltage pump 1 is deactivated. At the same time, the transistor P2 switches to the low-impedance state, and this raises the control input GndConnect to a high potential ($V_{DD}$), so that the transistor 2 is switched on. The output OUT of the voltage pump 1 and the network which is connected to it are thus connected to ground.

The proposed, programmable voltage pump makes it possible in a simple manner to program different (negative) output voltages, or to connect the output OUT of the voltage pump 1 selectively to ground and at the same time to deactivate the voltage pump 1.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A programmable voltage pump for producing an output voltage, comprising:
   a trim input configured to set the output voltage;
   an output configured to emit the output voltage;
   an activation/deactivation input configured to at least one of activate and deactivate the voltage pump, said activation/deactivation input comprising a switch connected to said output, said switch configured to selectively connect a network to ground, the network being connected to said output; and
   a control circuit configured to control said switch as a function of a signal which is applied to said trim input.

2. The programmable voltage pump according to claim 1, wherein said control circuit comprises a logic gate, and the signal applied to said trim input is applied to an input of said logic gate.

3. The programmable voltage pump according to claim 2, wherein an output of the logic gate is connected to said activation/deactivation input for at least one of activating and deactivating the voltage pump.

4. The programmable voltage pump according to claim 2, wherein the said logic gate is a NAND gate.

5. The programmable voltage pump according to claim 1, wherein said control circuit comprises a level shifter.

6. The programmable voltage pump according to claim 1, wherein said control circuit comprises a first pair and a second pair of MOS transistors.

7. The programmable voltage pump according to claim 6, wherein said second pair of MOS transistors are cross-coupled.

8. The programmable voltage pump according to claim 1, further comprising a deactivator for deactivating the voltage pump.

9. The programmable voltage pump according to claim 1, wherein said switch is an NMOS transistor.

10. The programmable voltage pump according to claim 3, wherein said logic gate is a NAND gate.

11. The programmable voltage pump according to claim 1, wherein the voltage pump is configured to be deactivated.

12. The programmable voltage pump according to claim 2, wherein said control circuit comprises a level shifter.

13. The programmable voltage pump according to claim 3, wherein said control circuit comprises a level shifter.

14. The programmable voltage pump according to claim 4, wherein said control circuit comprises a level shifter.

15. The programmable voltage pump according to claim 2, wherein said switch comprises an NMOS transistor.

16. The programmable voltage pump according to claim 3, wherein said switch comprises an NMOS transistor.

17. A programmable voltage pump for producing an output voltage, comprising:

a trim input configured to set the output voltage;

an output configured to emit the output voltage therefrom; and an activation/deactivation input configured to at least one of activate and deactivate the voltage pump, said activation/deactivation input comprising a switch connected to said output, said switch configured to selectively connect a network to ground, the network being connected to said output, wherein said switch comprises an NMOS-transistor, and a p-well of the NMOS transistor is connected to the output voltage.

18. The programmable voltage pump according to claim 17, wherein the output voltage is negative.

* * * * *